(12) United States Patent
Yoshida

(10) Patent No.: US 11,333,702 B2
(45) Date of Patent: May 17, 2022

(54) SEMICONDUCTOR DEVICE TEST METHOD

(71) Applicant: Fuji Electric Co., Ltd., Kanagawa (JP)

(72) Inventor: Mitsuru Yoshida, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 17/140,778

(22) Filed: Jan. 4, 2021

(65) Prior Publication Data

US 2021/0255239 A1 Aug. 19, 2021

(30) Foreign Application Priority Data

Feb. 13, 2020 (JP) .............................. JP2020-022881

(51) Int. Cl.
*G01R 31/28* (2006.01)

(52) U.S. Cl.
CPC ..... *G01R 31/2875* (2013.01); *G01R 31/2863* (2013.01)

(58) Field of Classification Search
CPC ............ G01R 31/2891; G01R 31/2874; G01R 31/2607
See application file for complete search history.

(56) References Cited

U.S. PATENT DOCUMENTS

| 7,023,229 B2 * | 4/2006 | Maesaki ............ G01R 31/2862 324/750.07 |
| 9,562,812 B2 * | 2/2017 | Yoshimura ............... G01K 7/01 |
| 2016/0252571 A1 | 9/2016 | Iwahashi et al. |

FOREIGN PATENT DOCUMENTS

| JP | S61-187245 A | 8/1986 |
| JP | 2010-040750 A | 2/2010 |
| JP | 5370323 B2 | 12/2013 |
| JP | 2016-161333 A | 9/2016 |

* cited by examiner

*Primary Examiner* — Tung X Nguyen
(74) *Attorney, Agent, or Firm* — Chen Yoshimura LLP

(57) ABSTRACT

A method for testing a semiconductor chip that has a pn junction constituting a parasitic diode therein includes: causing probe terminals to be in contact with front surface electrodes of the semiconductor chip; obtaining a temperature of the semiconductor chip by measuring electrical characteristics of the parasitic diode through at least one of the front surface electrodes and a back surface electrode and by referring to prescribed temperature characteristics of the parasitic diode; if the obtained temperature is not within a prescribed tolerance from the predetermined target temperature, heating up the semiconductor chip by applying voltage between one or more of the front surface electrodes and the back surface electrode; and once the obtained temperature increases and reaches the predetermined target temperature within the prescribed tolerance, testing electrical characteristics of the semiconductor chip through the front surface electrodes and the back surface electrode.

7 Claims, 11 Drawing Sheets

SEMICONDUCTOR DEVICE TEST METHOD

BACKGROUND OF THE INVENTION

Technical Field

The present invention relates to a method for testing a semiconductor device.

Background Art

In conventional test of a semiconductor device, a semiconductor chip (semiconductor substrate) is placed on a metal stage (hereinafter referred to as a test stage) of a test device so that the back electrode of the semiconductor chip is electrically connected to the test stage and probe terminals are made into contact with a front electrode of the chip. Then, by applying a voltage or passing a current between the electrodes on the respective main surfaces of the semiconductor chip via the probe terminals and the test stage, electrical characteristics of the semiconductor device formed on the semiconductor chip (hereinafter, the electrical characteristics of the semiconductor chip) are tested.

A conventional test method for a semiconductor device will be described. FIG. 10 is a flowchart showing an outline of a conventional semiconductor device test method. FIGS. 11A to 12 are explanatory views schematically showing states during the conventional test method. FIG. 11A schematically shows the vicinity of the transport arm 111 of a test apparatus 110. FIGS. 11B and 12 show schematically the vicinity of a tester (measuring instrument) 115 of the test apparatus 110. The conventional test apparatus 110 shown in FIGS. 11 A to 12 includes a test stage 113, probe terminals 114, a tester 115, and a contact block 120.

The test stage 113 is a metal stage on which the semiconductor chip 101 to be tested is placed with the back surface facing the test stage 113, and the back electrode (not shown) of the semiconductor chip 101 is connected to the tester 115 via wiring 117. The probe terminals 114 are metal contactors that contact the front surface electrodes (not shown) of the semiconductor chip 101 so as to apply a voltage or pass a current to the semiconductor chip 101. The tester 115 tests the electrical characteristics of the semiconductor device 101 (semiconductor device) in a state where a voltage is applied or a current is flowing.

The contact block 120 is a unit for electrically connecting the semiconductor chip 101 on the test stage 113 and the tester 115, and is composed of a set plate 121, plunger pins 122, springs 123, and a base unit 124. See, e.g., Patent Document 1. The set plate 121 has a plurality of through holes penetrating in the thickness direction, and a probe terminal 114 is inserted into each through hole. The set plate 121 is located above the test stage 113 during the test and faces the semiconductor chip 101 on the test stage 113.

The plunger pin 122 is a positioning component that determines the vertical position of the probe terminal 114, and is arranged for each probe terminal 114. One end (lower end) of the plunger pin 122 is connected to one end (upper end) of the probe terminal 114. The other end (lower end) of the probe terminal 114 protruding downward from the set plate 121 comes into contact with the semiconductor chip 101 during the test. The plunger pin 122 has a built-in spring 123 and has a function of moving and fixing the probe terminal 114 in the vertical direction by utilizing the elastic force of the spring 123.

The plunger pin 122 is accommodated by the base unit 124 so that the spring 123 portion is contained in the hollow rectangular parallelepiped base unit 124 and both ends project upward and downward of the base unit 124, respectively. The upper end of the plunger pin 122 projecting upward from the base unit 124 is electrically connected to the tester 115 via the wiring 116. The base unit 124 is arranged above the set plate 121, away from the set plate 121.

At the time of testing the semiconductor chip 101, first, a single semiconductor chip 101 to be tested is taken out from the supply tray 112 by the transport arm 111 and transported to the test stage 113 of the test apparatus 110 (step S101). Next, the conveyed semiconductor chip 101 is placed on the test stage 113 with the back surface facing the test stage 113, and the back surface (contact surface with the test stage 113) is sucked and fixed to the test stage 113 by the vacuum chuck 113a integrated with the test stage 113.

Next, the test stage 113 is moved to the tester 115 side, and the semiconductor chip 101 is placed below the probe terminal 114 (step S102). Next, by moving the test stage 113 vertically upward (in the direction of the arrows in FIG. 12), the front surface electrodes of the semiconductor chip 101 are brought into contact with the probe terminals 114 and electrically connected. The front surface electrodes of the semiconductor chip 101 are electrically connected to the tester 115 via the probe terminals 114 and the wiring 116, and the back electrode is electrically connected to the tester 115 via the test stage 113 and the wiring 117.

Next, a voltage is applied or a current is applied between the electrodes on both main surfaces of the semiconductor chip 101 via the probe terminal 114 under predetermined conditions, and the electrical characteristics of the semiconductor chip 101 are tested by the tester 115 (step S103). In the process of step S103, the test stage 113 is maintained at the set temperature (predetermined target temperature) T100 (see FIGS. 7 and 8), which is set for testing the semiconductor chip 101, by a heat controlling device (not shown), such as a heater, integrated with the test stage 113. The semiconductor chip 101 is heated up on the test stage 113 to reach the set temperature T100.

Next, the test stage 113 is moved to the transfer arm 111 side (step S104). Then, the transfer arm 111 picks up the tested semiconductor chip 101 on the test stage 113 and stores it in the supply tray 118 (step S105). The test is completed by repeating the processes of steps S101 to S105 for each semiconductor chip 101 for all the semiconductor chips 101 to be tested. The arrows 131a and 131b in FIG. 11 are the moving directions of the semiconductor chip 101, and the arrows 132 are the moving directions of the test stage 113.

As a conventional test method for a semiconductor device, a method has been proposed in which a temperature sensor is placed near the contact point between the probe terminals and the semiconductor chip, and the electrical characteristics of the semiconductor chip are tested based on the temperature measured by the temperature sensor. See, e.g., Patent Document 2 below. In Patent Document 2, by arranging the temperature sensor near the temperature measurement point of the temperature sensor, the interposition of substances having different thermal conductivity between the temperature sensor and the temperature measurement point for measurement is avoided. Thereby the temperature measurement accuracy is improved and the electrical characteristics of semiconductor chips are accurately tested.

Further, another conventional test method for a semiconductor device has been proposed such that, in the case where the semiconductor chip is cooled to a predetermined temperature to test the electrical characteristics, the contact position between the needle tip of the probe terminal and the front surface electrode of the semiconductor chip is corrected based on a correction amount obtained in advance. See, e.g., Patent Document 3 below. In Patent Document 3, by correcting the displacement due to heat shrinkage of the probe terminal, the needle tip of the probe terminal and the front surface electrode of the semiconductor chip are adequately brought into contact with each other, and the electrical characteristics of the semiconductor chip are accurately adjusted.

In addition, yet another conventional test method for a semiconductor device has been proposed such that, when high-precision temperature control is required, the number of probe terminals in contact with the semiconductor chip is reduced to test the electrical characteristics with a small current, and when such high-precision temperature control is not required, the number of probe terminals in contact with the semiconductor chip is increased to test the electrical characteristics with a large current. See, e.g., Patent Document 4 below. In Patent Document 4, when high-precision temperature control is required, the temperature drop of the semiconductor chip caused by the contact of the probe terminals is suppressed.

RELATED ART DOCUMENT

Patent Document

Patent Document 1: Japanese Patent No. 5370323
Patent Document 2: Japanese Patent Application Laid-Open Publication No. S61-187245
Patent Document 3: Japanese Patent Application Laid-Open Publication No. 2010-040750
Patent Document 4: Japanese Patent Application Laid-Open Publication No. 2016-161333

SUMMARY OF THE INVENTION

In Patent Document 2, even if the heat of the semiconductor chip is absorbed by the probe terminal at the moment when the probe terminal comes into contact with the heated-up semiconductor chip and the temperature of the semiconductor chip temporarily drops, the electrical characteristics of the semiconductor chip can be tested after waiting and confirming, via the temperature sensor, that the temperature of the semiconductor chip has returned (raised) to the predetermined temperature by temperature sensor. However, it takes time to raise the temperature of the semiconductor chip and stabilize it to the predetermined temperature due to the nature of the heat controlling device such as a heater, and therefore, it is not realistic to apply it to a test on semiconductor chips that must be performed in the order of seconds.

In the past, by improving the performance of the heater or the like, it was possible to reduce time required to stabilize the temperature of the semiconductor chip at the predetermined temperature by raising the temperature of the semiconductor chip beyond the predetermined temperature by the amount of the anticipated temperature drop due to the contact of the probe terminals. However, it is not possible to shorten the preheat time by the improvement of the heater performance. This is so especially in the initial stage of operation of the test device when the test device has been stopped for a while because the temperature of the semiconductor chip drops sharply due to the contact of the probe terminals in such a case, as compared with the case where the test device has been testing one or more semiconductor chips already.

The reason for that is as follows. At the initial stage of operation of the test device, the probe terminals have cooled down to room temperature. In contrast, if the test device has been testing one or more semiconductor chips, the temperature of the probe terminals becomes higher than room temperature by absorbing the heat of the one or more semiconductor chips that have been tested. Therefore, the semiconductor chip tested at the initial stage of operation of the test device may be wrongly determined to be a defective chip that does not have the electrical characteristics at the predetermined temperature because the electrical characteristic test is conducted in a state where the temperature is not stabilized at the predetermined temperature.

Also in Patent Document 3, the control for correcting the displacement due to thermal shrinkage of the probe terminals takes several minutes just like it takes time for the temperature control to raise the temperature of the semiconductor chip to the predetermined temperature whose temperature has dropped due to the contact of the probe terminals. Further, Patent Document 4 discloses that even when the number of probe terminals in contact with the semiconductor chip is reduced and the electrical characteristics of the semiconductor chip are tested with a small current, a waiting time of about 5 seconds is needed to raise the temperature of the semiconductor chip to the predetermined temperature once the temperature of the semiconductor chip has been lowered by the contact of the probe terminals.

As described above, when the probe terminal is brought into contact with the semiconductor chip in order to test the electrical characteristics of the semiconductor chip heated to a high temperature, if the semiconductor chip is brought into contact with the probe terminal having a temperature lower than that of the semiconductor chip, the temperature of the semiconductor chip temporarily drops. To cope with this, the preheating time of the semiconductor chip needs to be set to, for example, several seconds to several hundreds of seconds, which is problematic. Further, the test of the electrical characteristics may have been started in a state where the temperature of the semiconductor chip is not stabilized at the predetermined temperature, and if so, the electrical characteristics cannot be tested accurately, which is another problem.

By heating up the probe terminals 114 with a heat controlling device such as a heater and maintaining the temperature at the same temperature as that of the semiconductor chip 101, the preheating time of the semiconductor chip 101 can technically be shortened. However, equipment such as a heater for heating the probe terminals 114 is difficult to be placed near the position of the test stage 113 during the processing of step S102 (FIG. 10). See, FIGS. 11A to 12. Even if equipment such as a heater for heating the probe terminals 114 could be arranged at that position, there is a concern that the workability of replacing the contact block 120 may be impaired as a result.

The present invention is devised in view of the foregoing and aims at providing a high-temperature test of a semiconductor chip capable of accurately testing the electrical characteristics of the semiconductor device formed on the semiconductor chip in a short time, solving one or more of the above-mentioned problems.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a method for testing a semiconductor chip that has front surface electrodes and a back surface electrode and has a pn junction constituting a diode therein, the method comprising: placing a semiconductor chip on a metal stage so that the back surface electrode is in contact with the metal stage; raising a temperature of the semiconductor chip on the metal stage towards a predetermined target temperature by raising a temperature of the metal stage to the predetermined target temperature; causing probe terminals to be in contact with the front surface electrodes of the semiconductor chip; obtaining a temperature of the semiconductor chip by measuring electrical characteristics of the diode through at least one of the front electrodes and the back surface electrode and by referring to prescribed temperature characteristics of the diode; if the obtained temperature is not within a prescribed tolerance from the predetermined target temperature, heating up the semiconductor chip by applying voltage between one or more of the front surface electrodes and the back surface electrode; repeating the step of obtaining the temperature of the semiconductor chip and the step of heating up the semiconductor chip until the obtained temperature increases and reaches the predetermined target temperature within the prescribed tolerance; and thereafter, testing electrical characteristics of the semiconductor chip through the front surface electrodes and the back surface electrode.

In the above-described method, the diode may be a parasitic diode in the semiconductor cell.

In the above-described method, the voltage applied in the step of heating up the semiconductor chip may be such that a resulting temperature increase does not exceed a difference between the predetermined target temperature and the obtained temperature.

In the above-described method, in the step of obtaining the temperature of the semiconductor chip, the electrical characteristics of the diode to be measured may be a forward voltage of the diode, and the prescribed temperature characteristics of the diode referred to may be forward characteristics of the diode indicating a relationship between a temperature and the forward voltage.

The above-described method may further include: placing another semiconductor chip of the same configuration as said semiconductor chip on the metal stage so that the back surface electrode is in contact with the metal stage; repeatedly performing the step of heating up, which has been performed for said semiconductor chip, with respect to said another semiconductor chip under same conditions as for said semiconductor chip, without performing the repeated step of obtaining the temperature that has been performed for said semiconductor chip; and thereafter, testing electrical characteristics of said another semiconductor chip through the front surface electrodes and the back surface electrode.

According to the above-described one or more aspects of the present invention, the temperature of the semiconductor chip can be controllably raised by the amount of the temperature decrease due to the contact of the probe terminals so as to stabilize the temperature at the set target temperature. As a result, the preheating time of the semiconductor chip can be shortened. Further, it is possible to avoid starting the electrical characteristics test in a state where the temperature of the semiconductor chip is not stabilized at the set temperature.

According to the method for testing a semiconductor device according to one or more of these aspects of the present invention, in a high temperature test of a semiconductor chip, it is possible to accurately test the electrical characteristics of the semiconductor device formed in the semiconductor chip in a short time.

It is to be understood that both the foregoing general description and the following detailed description are exemplary and explanatory, and are intended to provide further explanation of the invention as claimed.

DETAILED DESCRIPTION OF EMBODIMENTS

Figure 1:
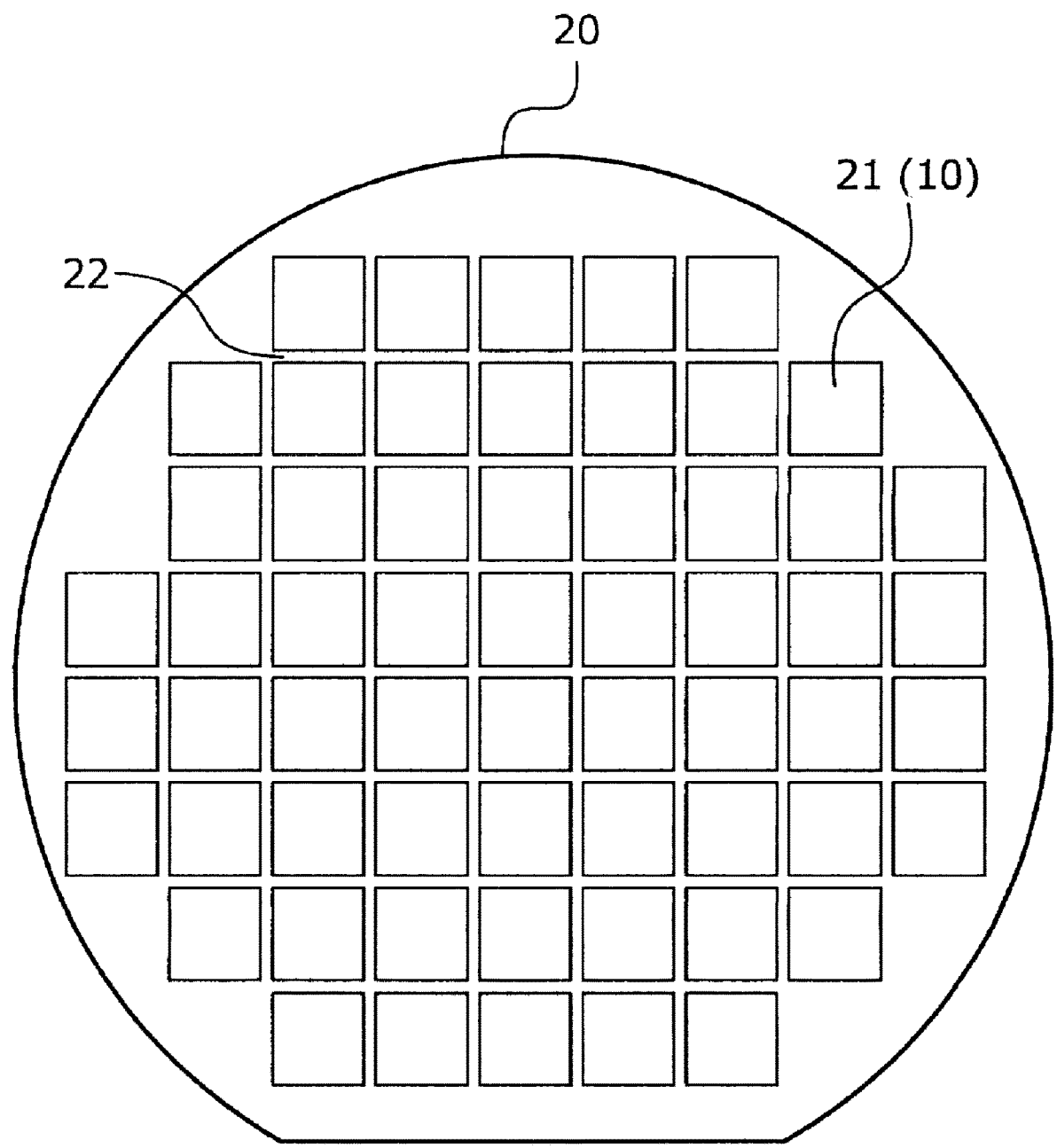
FIG. 1 is a plan view showing a layout of a semiconductor wafer on which semiconductor devices to which a test method of the semiconductor device according to an embodiment of the present invention is applicable are manufactured, as viewed from the front surface side.

Hereinafter, preferred embodiments of the semiconductor device test method according to the present invention will be described in detail with reference to the accompanying drawings. In the present specification and the accompanying drawings, n or p in layers or regions means that electrons or holes are the majority carries in the layers or regions marked with n or p, respectively. Further, the sign, + or −, attached to n and p means that the impurity concentration is higher, or the impurity concentration is lower, than that of the layer or region without it, respectively. In the following description of the embodiments and the accompanying drawings, the same reference numerals are given to the same configurations, and duplicate description will be omitted.

Embodiments

Figure 2:
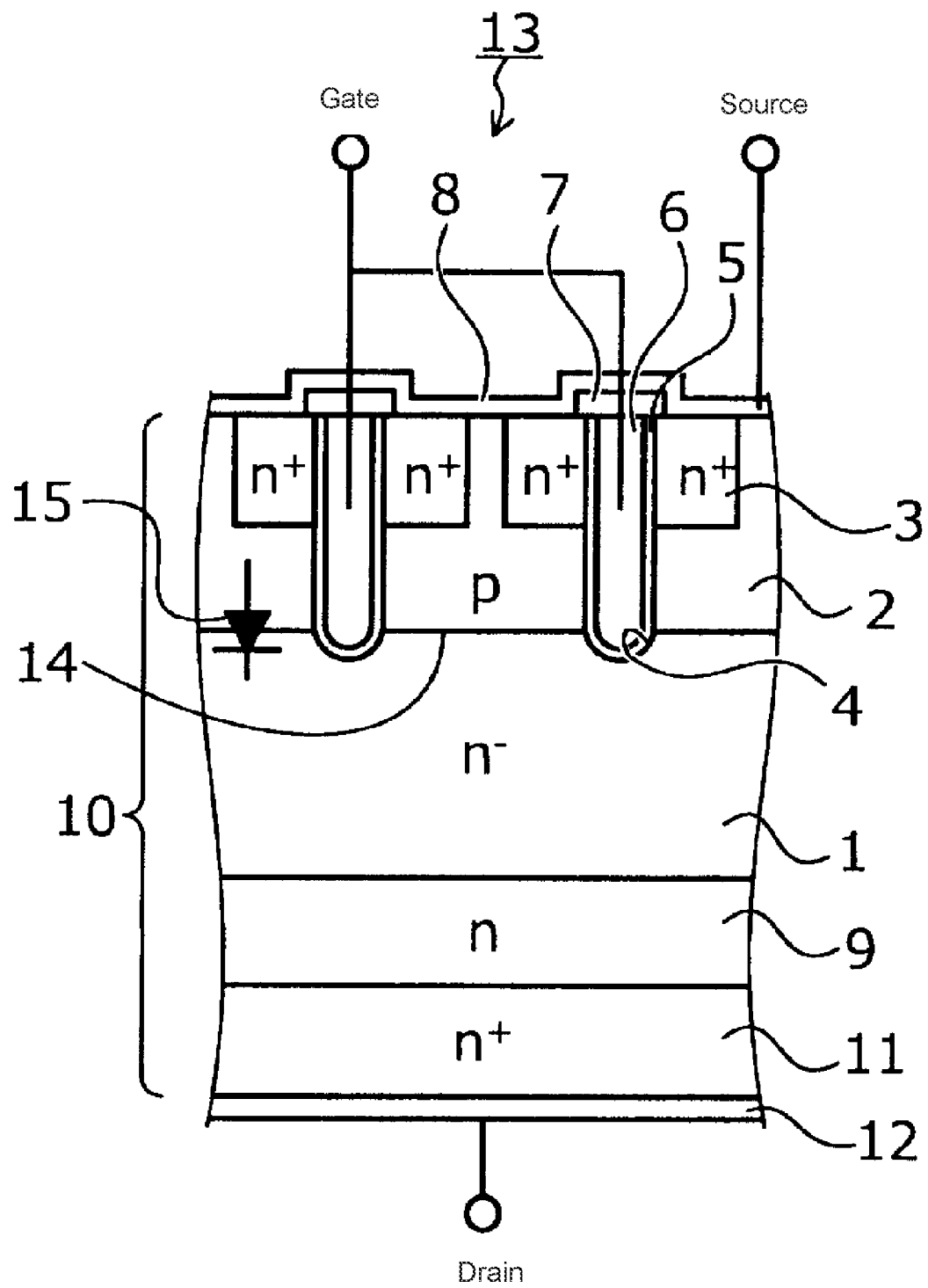
FIG. 2 is a sectional drawing showing an example of the structure of a semiconductor device to which a test method of the semiconductor device according to an embodiment of the present invention can be applied.

FIG. 1 is a plan view showing a layout of a semiconductor wafer in which semiconductor devices to which the test method of the semiconductor device according to an embodiment of the present invention is applied are manufactured, as viewed from the front surface side. FIG. 1 shows a semiconductor wafer 20 before dicing (cutting) into semiconductor chips (semiconductor substrates) 10 used in the test method of the semiconductor device according to the embodiment. FIG. 2 is a cross-sectional view showing an example of the structure of a semiconductor device to which the test method of the semiconductor device according to the embodiment can be applied. FIG. 2 shows a cross-sectional structure of a semiconductor device 13 manufactured in a region (hereinafter referred to as a chip region) 21 that becomes a semiconductor chip 10 after dicing (cutting) of the semiconductor wafer 20.

As shown in FIG. 1, in the semiconductor wafer 20, for example, a plurality of chip regions 21 having a substantially rectangular planar shape are arranged in a matrix. A semiconductor device 13 shown in FIG. 2 to which the test method of the semiconductor device according to the embodiment can be applied is manufactured in each of the chip regions 21 of the semiconductor wafer 20. The circumference of the chip region 21 is surrounded by the scribe lines 22. The scribe lines 22 are arranged in a grid pattern on the semiconductor wafer 20. By dicing the semiconductor wafer 20 along the scribe line 22, the chip regions 21 are separated into individual semiconductor chips 10.

The semiconductor device 13 shown in FIG. 2 to which the semiconductor device test method according to the embodiment can be applied is a semiconductor element having specified temperature characteristics. For example, it is a semiconductor device having a parasitic diode (body diode) 15 formed by a pn junction 14 at a predetermined position inside the semiconductor chip 10. As will be described in detail later, in the test method of the semiconductor device according to the present embodiment, the temperature of the semiconductor chip 10 is obtained by utilizing the temperature characteristic of the forward voltage of the parasitic diode 15 formed by the pn junction 14. If the obtained temperature is determined to be insufficiently low, by causing forward current to flow in the parasitic diode 15, for example, the temperature of the semiconductor chip 10 is raised towards the target temperature.

If the semiconductor chip 10 is equipped with a temperature sensor in addition to the semiconductor device 13, which is the main semiconductor element, instead of the temperature characteristics of the parasitic diode 15 formed by the pn junction 14, the temperature characteristic of the temperature sensor may be used. The temperature sensor may be, for example, a polysilicon (poly-Si) diode provided on the front surface of the semiconductor chip 10 via an insulating film (not shown), or a diffusion diode formed of a pn junction (other than the pn junction 14) inside the semiconductor chip 10 that has a function of detecting the temperature of the main semiconductor element by utilizing the temperature characteristics of the diode.

Specifically, the semiconductor device 13 is, for example, a MOSFET (Metal Oxide Semiconductor Field Effect Transistor having an insulate gate structure made of a three-layer structure of metal-oxide-semiconductor), an IGBT (Insulated Gate Bipolar Transistor), an FWD (Free Wheeling Diode), or an SBD (Schottky Barrier Diode), which have known or design temperature characteristics.

Further, the semiconductor device 13 may include a plurality of semiconductor elements in the same semiconductor chip 10. For example, it may include a reverse conducting IGBT (RC-IGBT: Reverse Conducting IGBT) in which an IGBT and an FWD connected in antiparallel to the IGBT are built in the same semiconductor chip 10, or a reverse-blocking IGBT (RB-IGBT: Reverse Blocking IGBT) having a reverse direction voltage withstanding property due to a termination structure in which the pn junction between the collector region and drift region of the IGBT is extended from the back surface to the front surface of the semiconductor chip 10 along the end side surface of the semiconductor chip 10. Here, the withstand voltage is the upper limit voltage at which the semiconductor element does not malfunction or break at that working voltage.

FIG. 2 shows a cross-sectional structure when the semiconductor device 13 is an n-channel vertical MOSFET having a trench gate structure. In this example, the semiconductor device 13 has a typical MOS (metal-oxide-semiconductor) gate structure, having a p-type base region 2, an n+ type source region 3, a trench 4, a gate insulating film 5, and a gate electrode 6 on the front surface side of the semiconductor chip 10. In the semiconductor chip 10, an n+ type drain region 11 is provided on the back surface side of the semiconductor chip 10, and between the p-type base region 2 and the n+ type drain region 11, an n− type drift region 1 is provided so as to be in contact with these regions.

The parasitic diode 15 is formed at the pn junction 14 between the p-type base region 2 and the n− type drift region 1. Between the n− type drift region 1 and the n+ type drain region 11, an n-type field stop region 9 for preventing the depletion layer that extends from the pn junction 14 when the semiconductor device 13 is in the OFF state from reaching the n+ type drain region 11 may be provided. A p+ type contact region (not shown) having a function of reducing the contact resistance between the semiconductor chip 10 and the source electrode 8 may be provided on the front surface side of the semiconductor chip 10. Reference numerals 7 and 12 are an interlayer insulating film and a drain electrode, respectively.

When the semiconductor device 13 is an IGBT (not shown) or an RB-IGBT, the n+ type emitter region 3, the n+ type drain region 11, the source electrode 8, and the drain electrode 12 are replaced with an n+ type emitter region, a p+ type collector region, an emitter electrode, and a collector electrode, respectively. In this case, in the test method of the semiconductor device according to the present embodiment, instead of the temperature characteristic of the parasitic diode 15 formed by the pn junction 14, the temperature characteristic of a parasitic diode formed by a pn junction made of the p+ type collector region and the n− type drift region 1, which conducts when a positive voltage is applied to the collector electrode relative to the emitter electrode to turn on the MOS gate, may be used.

When the semiconductor device 13 is a FWD (not shown), the temperature characteristics of the FWD, which is the main semiconductor element, may be used in the test method of the semiconductor device according to the present embodiment. When the semiconductor device 13 is an RC-IGBT (not shown), any one of the temperature characteristics of the parasitic diode 15 formed by the pn junction 14 between the p type base region 2 and the n− type drift region 1 of the IGBT constituting the RC-IGBT, the temperature characteristic of a parasitic diode formed by the pn junction of the p+ type collector region of the IGBT and the n− type drift region 1 constituting the RC-IGBT, and the temperature characteristic of the FWD constituting the RC-IGBT may be used.

Figure 3:
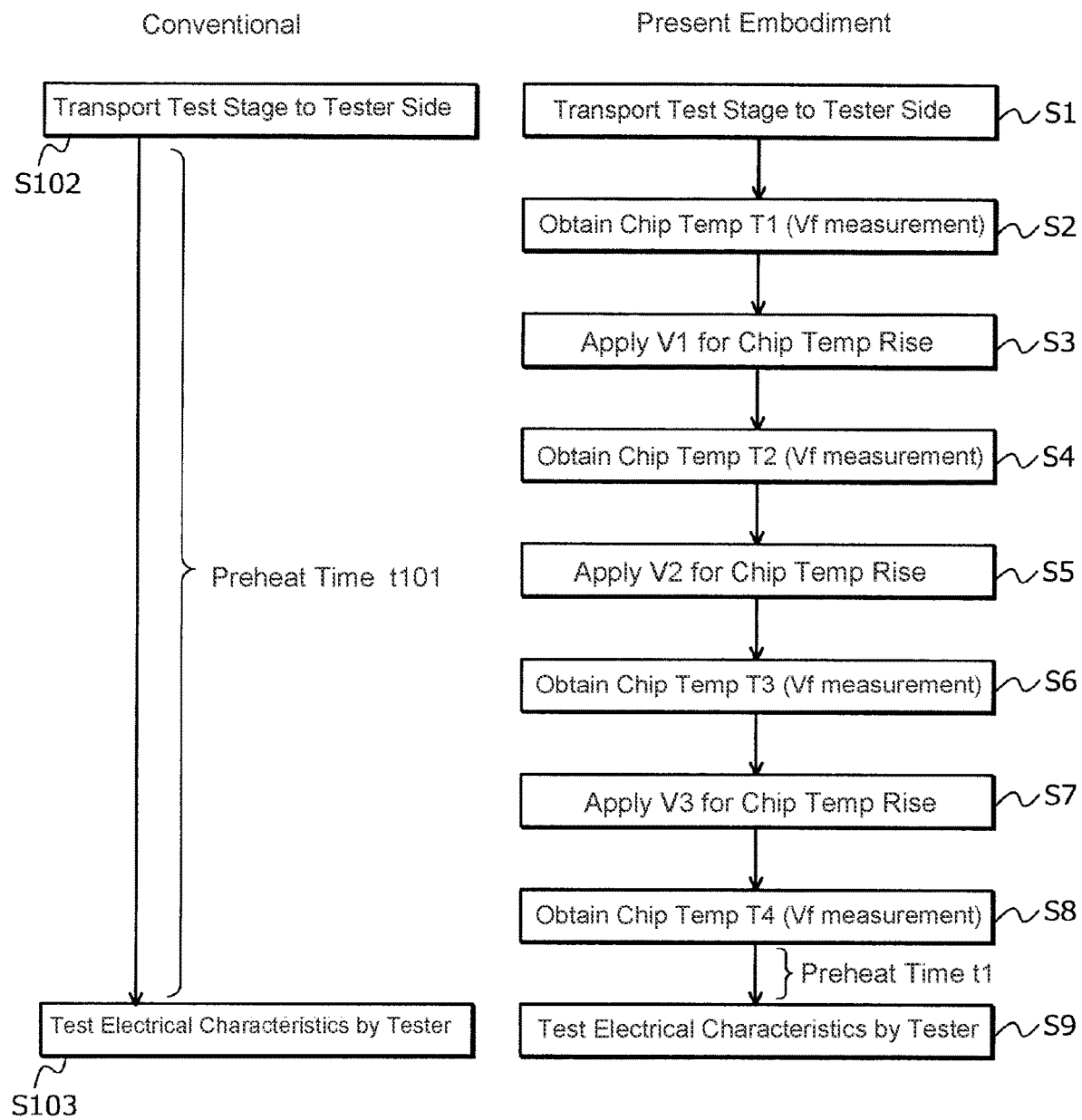
FIG. 3 is a flowchart showing an outline of a test method of a semiconductor device according to an embodiment of the present invention.

Next, the test method of the semiconductor device according to the present embodiment will be described with reference to FIGS. 2 to 4 and 12 to 14, taking the case where the semiconductor device 13 for testing the electrical characteristics is a MOSFET (see FIG. 2) as an example. FIG. 3 is a flowchart showing an outline of a test method for a semiconductor device according to the present embodiment. In FIG. 3, in order to clarify the differences between the semiconductor device test method according to the present embodiment and the conventional semiconductor device test method (hereinafter referred to as the conventional method: see FIG. 10), a part of the test method of the semiconductor device of the present embodiment (steps S1 to S9) are shown on the right side, and a corresponding part of the conventional method (processing of steps S102 and S103 in FIG. 10) is shown on the left side.

The processes of steps S1 and S9, which will be described later, of the semiconductor device test method of the present embodiment are the same as the processes of steps S102 and S103 of the conventional method, respectively. Therefore, in FIG. 3, steps S102 and S103 of the conventional method are shown side by side on the left side of steps S1 and S9 of the semiconductor device test method of the embodiment, respectively. Although the processing performed before step S1 and the processing performed after the processing of step S9 of the semiconductor device test method of the embodiment are omitted, the same processing as in step S101 of the conventional method is performed before step S1 and the same processing as in steps S104 and S105 is performed after step S9.

Figure 11A:
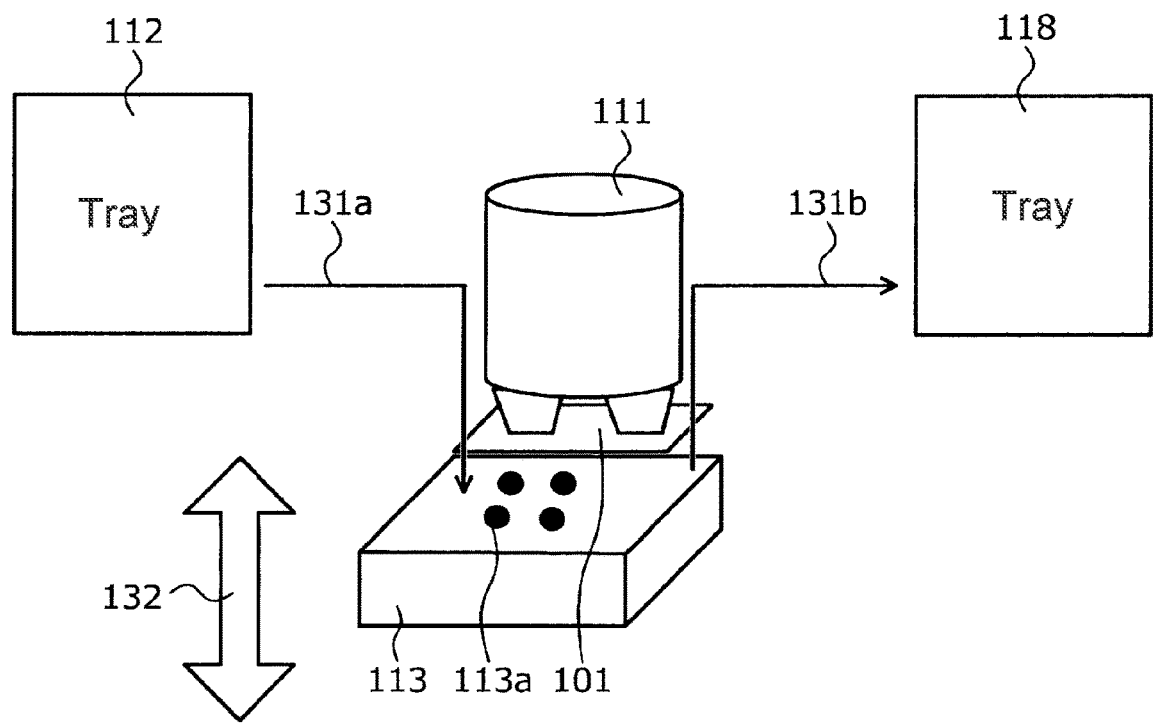
FIGS. 11A-11B are explanatory drawings showing states in the middle of the conventional test of a semiconductor device.
Figure 11B:
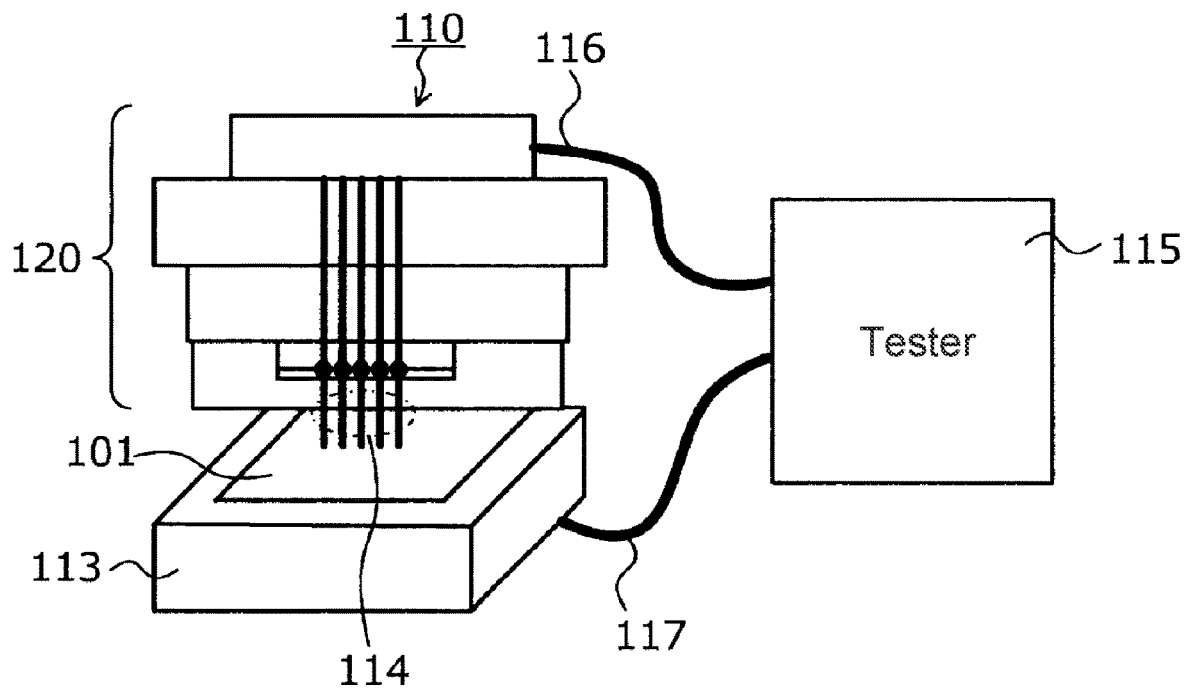
Figure 12:
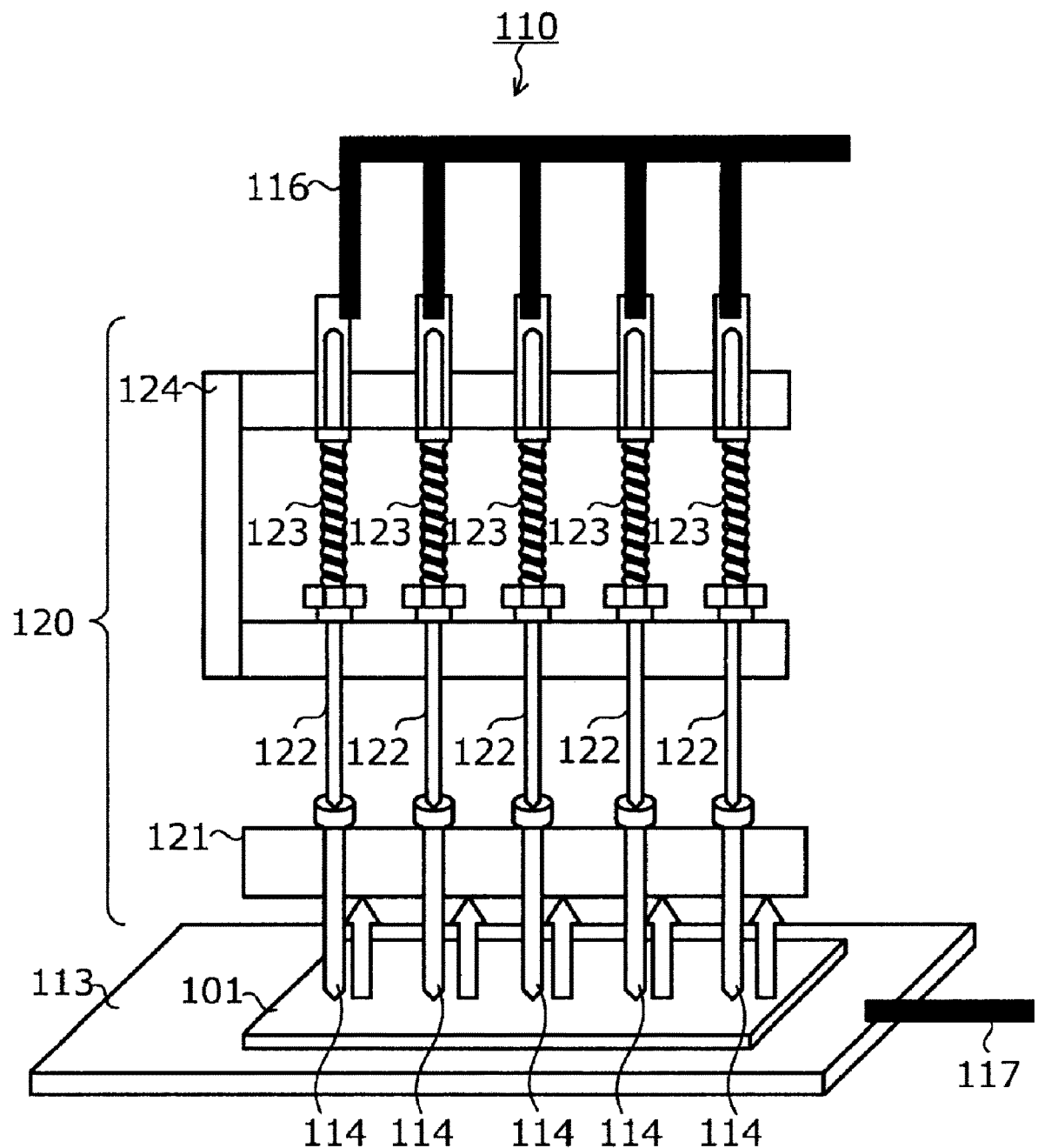
FIG. 12 is an explanatory drawing showing a state in the middle of the conventional test of a semiconductor device.

The temperature characteristics of the parasitic diode 15 formed by the pn junction 14 of the semiconductor device 13 to be tested by the test method of the semiconductor device of the present embodiment are obtained in advance by a known method before the processing of step S2 (see FIG. 3) described later. In the method of testing the semiconductor device of the present embodiment, the general test device 110 shown in FIGS. 11A to 12 described above can be used, and thus the description of the configuration of the test device 110 will be omitted. Here, because the test of the present embodiment is performed using the test device 110 as an example, each step of the test of the present embodiment is explained by replacing the semiconductor device 101 of FIGS. 11A to 12 with the semiconductor chip 10.

Figure 4:
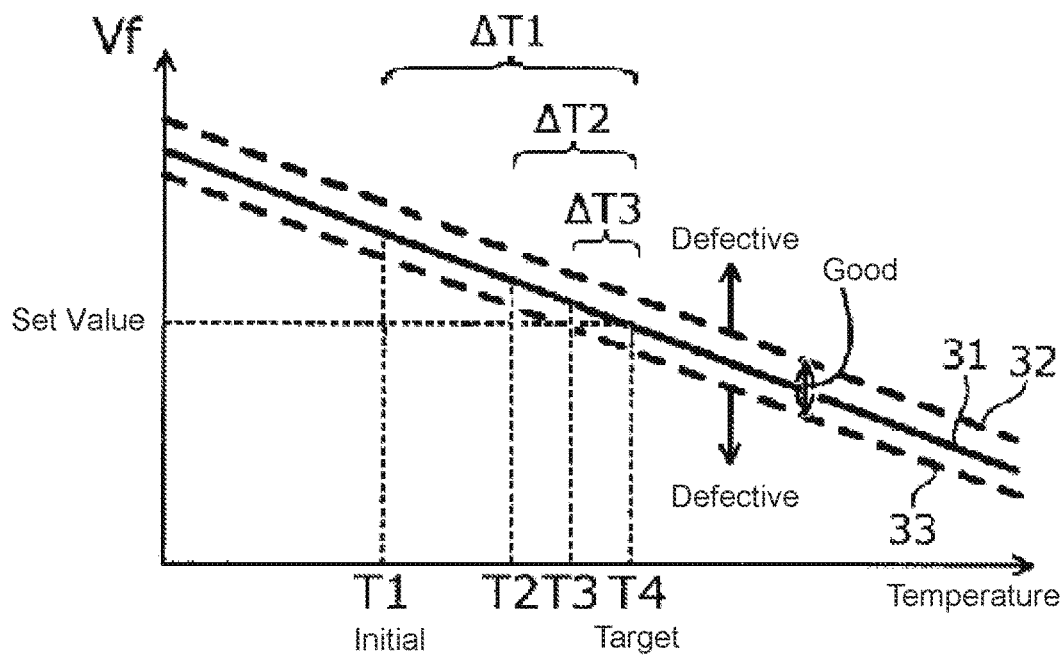
FIG. 4 is a characteristic diagram showing a relationship between a forward voltage of a parasitic diode and the temperature thereof.

FIG. 4 shows a relationship between the forward voltage of the parasitic diode 15 and the temperature thereof. The horizontal axis of FIG. 4 shows the temperature of the semiconductor chip 10, and the vertical axis shows the forward voltage Vf of the parasitic diode 15. Reference numeral 31 indicates the relationship (characteristics) between the temperature of the semiconductor chip 10 and the forward voltage Vf of the normal (non-defective) parasitic diode 15 when the semiconductor device 13 is a non-defective product, and indicates linearity (hereinafter, referred to as a non-defective parasitic diode straight line).

Reference numerals 32 and 33 indicate respective examples of an upper limit value and a lower limit value due to the fluctuations of non-defective parasitic diode 15 caused by fluctuations in the manufacturing conditions, etc., respectively, and are straight lines above and below the non-defective product straight line 31 parallel to the non-defective product straight line 31 (hereinafter may be referred to as, respectively, the good parasitic diode upper limit and the good parasitic diode lower limit value). By suppressing the fluctuations of the forward voltage Vf of the parasitic diode 15 within such a prescribed range, it becomes possible to obtain the temperature of the semiconductor chip 10 accurately by detecting the forward voltage Vf. The determination as to whether or not the fluctuation of the forward voltage Vf of the parasitic diode 15 is suppressed within such a prescribed range may be made for every wafer or every lot of the production. The non-defective parasitic diode straight line 31, the non-defective parasitic diode upper limit 32, and the non-defective parasitic diode lower limit 33 may be calculated in advance from, for example, the specification values (design values) of the semiconductor device 13. T1, T2, T3, T4, ΔT1, ΔT2, ΔT3, etc., will be described later.

Figure 10:
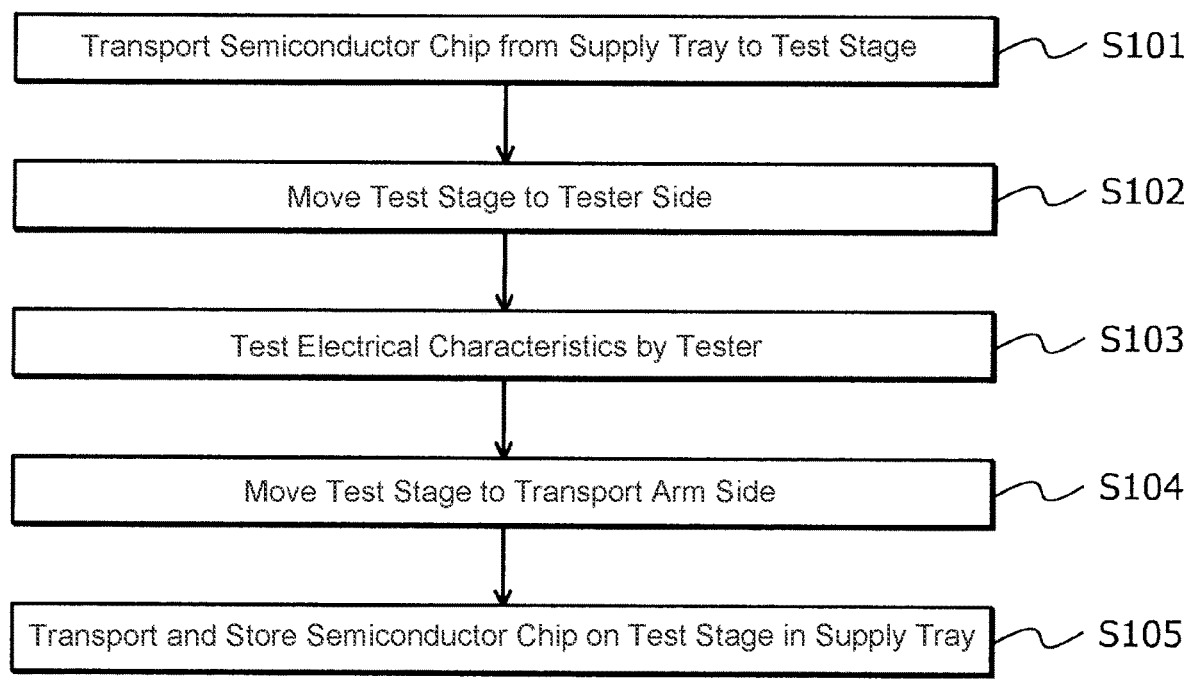
FIG. 10 is a flowchart showing an outline of a conventional test method of a semiconductor device.

To test the semiconductor chip 10 by the semiconductor device test method of the present embodiment, first, a single semiconductor chip 10 to be tested is taken out from the supply tray 112 by the transport arm 111, and transported to the test stage 113 of the test device 110 (same process as step S101 in FIG. 10: transporting step). A plurality of semiconductor chips 10 to be tested are stored in the supply tray 112. Next, the transported semiconductor chip 10 is placed on the test stage 113 with the back surface facing the test stage 113, and the back surface (contact surface with the test stage 113) is sucked and fixed to the test stage 113 by the vacuum chuck 113a integrated with the test stage 113.

Next, the test stage 113 is moved to the tester 115 side, and the semiconductor chip 10 is placed below the probe terminals 114 of the contact block 120 (step S1). A contact block 120 in which a plurality of probe terminals 114 are arranged according to the arrangement of the front surface electrodes of the semiconductor chip 10 is attached to the test device 110 in advance. The number of probe terminals 114 is set according to the voltage value of the voltage applied to the semiconductor device 13. Next, the test stage 113 is moved vertically upward, and the front surface electrodes of the semiconductor chip 10 is brought into contact with the probe terminals 114 so as to be electrically connected.

The front surface electrodes of the semiconductor chip 10 are surface electrodes formed on the front surface of the semiconductor chip 10, and also serve as electrode pads to which a lead wires or other wires are bonded when the semiconductor chip 10 is mounted. Specifically, in the semiconductor device 13 of this example, the front surface electrodes of the semiconductor chip 10 are the source electrode 8, which also serves as a source pad (an electrode pad), and a gate pad (an electrode pad: not shown) to which all gate electrodes 6 are electrically connected. Different probe terminals 114 come into contact with the source pad and the gate pad so as to apply a source potential and a gate potential, respectively, in the process of step S9 described later.

The back surface electrode of the semiconductor chip 10 is a surface electrode formed on the back surface of the semiconductor chip 10, and is an electrode pad that is to be solder-bonded onto a circuit pattern made of, for example, copper foil, of a circuit board on which the semiconductor chip 10 is mounted. Specifically, in the semiconductor device 13 of this example, the back surface electrode of the semiconductor chip 10 is a drain electrode 12 that also serves as a drain pad (electrode pad). The front surface electrodes of the semiconductor chip 10 are electrically connected to the tester 115 via the probe terminals 114 and the wiring 116, and the back electrode is electrically connected to the tester 115 via the test stage 113 and the wiring 117.

The test stage 113 is maintained at the set temperature (predetermined target temperature) T0 for testing he semiconductor chip 10 by, for example, a heat controlling device (not shown) such as a heater integrated with the test stage 113. The semiconductor chip 10 is heated up by the test stage 113 to the set temperature T0 (setting step). The probe terminals 114 stand by in a room temperature (for example, about 25° C.) environment and are not heated up when they are not in contact with the semiconductor chip 10. Therefore, when the probe terminals 114 having a temperature lower than that of the semiconductor chip 10 come into contact with the semiconductor chip 10, the heat of the semiconductor chip 10 is absorbed by the probe terminals 114, and the temperature of the semiconductor chip 10 temporarily drops.

Therefore, after the first contact of the probe terminal 114, the temperature (hereinafter, referred to as the initial temperature) T1 of the semiconductor chip 10 whose temperature has dropped due to the contact of the probe terminals 114 is obtained (step S2). Then, the first temperature difference ΔT1 between the set temperature T0 for testing and the initial temperature T1 of the semiconductor chip 10 obtained in step S2 is calculated. The set temperature T0 for testing is the predetermined target temperature of the semiconductor chip 10 (chip temperature) to be reached when testing the electrical characteristics of the semiconductor device 13 formed on the semiconductor chip 10 (hereinafter referred to as the electrical characteristics of the semiconductor chip 10) in step S9 described later.

Specifically, a positive voltage is applied to the source electrode 8 with respect to the drain electrode 12 via the probe terminal 114 so as to conduct the parasitic diode 15, and the forward voltage Vf of the parasitic diode 15 is measured by the tester 115. As the temperature of the semiconductor chip 10 becomes higher, the forward voltage of the parasitic diode 15 shifts towards a lower voltage side. Therefore, by acquiring the temperature characteristics (temperature dependence of the forward voltage) of the parasitic diode 15 of the semiconductor device 13 in advance, the measured value of the forward voltage Vf of the parasitic diode 15 by the tester 115 can be used to obtain the initial temperature T1 of the semiconductor chip 10.

Next, the initial temperature T1 of the semiconductor chip 10 is raised by a first temperature difference ΔT1 to compensate for the dropped temperature of the semiconductor chip 10 so that the chip temperature becomes or approaches the set temperature T0. At this time, it is preferable to gradually and stepwise increase the temperature of the semiconductor chip 10 and obtains the temperature of the semiconductor chip 10 (obtaining step in the test process) every time the temperature of the semiconductor chip 10 is raised in a small step (heat generation step in the test step) so that the temperature of the semiconductor chip 10 does not exceed the set temperature T0. This is desirable because if the temperature of the semiconductor chip 10 should rise beyond the temperature difference tolerance of the set temperature T0 described later, the test must be held off until the heat of the semiconductor chip 10 naturally dissipated to the atmosphere and the temperature of the semiconductor chip 10 falls within the temperature difference tolerance with the set temperature T0.

Specifically, in order to raise the temperature by the amount of the temperature drop (first temperature difference ΔT1) stepwisely, a prescribed positive voltage V1 is applied to the drain electrode 12 relative to the source electrode 8 via the probe terminal 114 (step S3) so that the semiconductor device 13 is turned on to generate heat, thereby raising the temperature of the semiconductor chip 10. Here, the applied voltage V1 is set so that the resulting temperature rise of the semiconductor chip 10 is, for example, about half of the first temperature difference ΔT1. In general, the parasitic diode 15 is not designed to be able to apply a high forward voltage Vf that raises the temperature of the semiconductor chip 10. But if the parasitic diode 15 can generate sufficient heat so that the temperature of the semiconductor chip 10 rises, instead of heating the semiconductor device 13, the parasitic diode 15 may be heated so as to raise the temperature of semiconductor chip 10.

Then, the same processes as in steps S2 and S3 are repeated until the temperature of the semiconductor chip 10 is further raised and becomes close to the target temperature T0 (here, the processes in steps S4 and S5 and the processing in steps S6 and S7). Specifically, the forward voltage Vf of the parasitic diode 15 is measured by the tester 115, and the temperature T2 of the semiconductor chip 10 is obtained in the same manner as in step S2 (step S4). Then, the second temperature difference ΔT2 between the set temperature T0 for testing the semiconductor chip 10 and the temperature T2 of the semiconductor chip 10 acquired in the process of step S4 is calculated.

Next, a predetermined voltage V2 is applied to the semiconductor device 13 (step S5) in the same manner as in step S3 to raise the temperature of the semiconductor chip 10. The applied voltage V2 is set so that, for example, the temperature rise of the semiconductor chip 10 is about half of the second temperature difference ΔT2. Next, the forward voltage Vf of the parasitic diode 15 is measured by the tester 115, and the temperature T3 of the semiconductor chip 10 is obtained in the same manner as in step S2 (step S6). Then, the third temperature difference ΔT3 between the set temperature T0 for testing the semiconductor chip 10 and the temperature T3 of the semiconductor chip 10 obtained in step S6 is calculated.

Next, a predetermined voltage V3 is applied to the semiconductor device 13 (step S7) in the same manner as in step S3 to raise the temperature of the semiconductor chip 10. The applied voltage V3 is set so that, for example, the temperature rise of the semiconductor chip 10 is about the same as the third temperature difference ΔT3. Next, the forward voltage Vf of the parasitic diode 15 is measured by the tester 115, and the temperature T4 of the semiconductor chip 10 is obtained in the same manner as in step S2 (step S8). If the temperature T4 of the semiconductor chip 10 obtained in the process of step S8 is near the target temperature T0, the process proceeds to the process of step S9 described later.

More specifically, the processes of steps S2 to S8 will be described by exemplifying the temperatures T1 to T4 of the semiconductor chip 10. It is assumed that the set temperature T0 for testing the semiconductor chip 10 is 155° C., and the initial temperature T1 of the semiconductor chip 10 obtained in step S2 is 153° C. In this case, since the first temperature difference ΔT1 is 2° C., the temperature of the semiconductor chip 10 is raised by 1° C. by the voltage V1 applied to the semiconductor device 13 in the process of step S3. As a result, the temperature T2 of the semiconductor chip 10 obtained in the process of step S4 becomes 154° C., and the second temperature difference ΔT2 becomes 1° C.

Next, in step S5, the temperature of the semiconductor chip 10 is raised by 0.5° C. by the voltage V2 applied to the semiconductor device 13. As a result, the temperature T3 of the semiconductor chip 10 obtained in step S6 becomes 154.5° C., and the third temperature difference ΔT3 becomes 0.5° C. Next, in step S7, the temperature of the semiconductor chip 10 is raised by 0.5° C. by the voltage V3 applied to the semiconductor device 13. As a result, the temperature of the semiconductor chip 10 acquired in step S8 becomes 155° C., and the temperature difference of the semiconductor chip 10 from the set temperature T0 for testing becomes 0° C., so the process proceeds to step S9.

Here, as the temperatures T1 to T4 of the semiconductor chip 10 approach the set temperature T0 for testing the semiconductor chip 10, the voltages V1 to V3 applied to the semiconductor device 13 become smaller. For example, when the temperature difference between the temperature of the semiconductor chip 10 and the set temperature T0 for testing the semiconductor chip 10 becomes about ±0.5° C., the applied voltage is such that even if the temperature of the semiconductor chip 10 is raised by the temperature difference at once, the temperature of the semiconductor chip 10 does not easily rise significantly beyond the set temperature T0 for testing the semiconductor chip 10. Therefore, the temperature of the semiconductor chip 10 may be raised at once by the temperature difference.

The temperature difference tolerance between the temperature T4 of the semiconductor chip 10 and the set target temperature T0 for testing the semiconductor chip 10 may be set to, for example, about ±0.5° C. After step S8 and before shifting to the process of step S9, the semiconductor chip 10 may stand by so as to be heated by the heater of the test stage 113 or the like until the temperature of the semiconductor chip 10 (temperature T4) is stabilized at the set temperature T0. Since the temperature 4 of the semiconductor chip 10 is already close to the set temperature T0 during the process of step S8, the standby time (preheat time) t1 is as short as about 1 second, for example, even for testing a first semiconductor chip 10 to which the probe terminals 114 at room temperature will be in contact.

In this way, the temperature of the semiconductor chip 10 is gradually and stepwisely increased so that the temperature of the semiconductor chip 10 is increased by the first temperature difference ΔT1 that corresponds to the temperature drop due to the contact of the probe terminals 114 and is stabilized at the set temperature T0. Next, a positive voltage is applied to the drain electrode 12 relative to the source electrode 8 via the probe terminal 114, and the electrical characteristics of the semiconductor chip 10 are tested by the tester 115 (step S9). During the process of step S9, since the temperature of the semiconductor chip 10 has been stabilized at the set temperature T0 as described above, the electrical characteristics of the semiconductor chip 10 can be accurately measured, and erroneous determination of a non-defective product/defective product can be avoided.

Here, the temperature characteristic of the parasitic diode 15 is uniquely determined in accordance with the design of the semiconductor device 13. Therefore, in the repeated tests, if the temperature increases (the first to third temperature differences ΔT1 to ΔT3) of the semiconductor chip 10 with respect to the forward voltage Vf (set value) of the parasitic diode 15 at the set temperature T0 at the time of testing the semiconductor chip 10 deviate from the temperature characteristics of the parasitic diode 15 when the temperature of the semiconductor chip 10 is gradually raised in steps S2 to S8 described above (that is, if the temperature characteristics of the parasitic diode 15 is determined to be abnormal), such a semiconductor chip 10 can be regarded as a defective product without reaching step S8 (i.e., without raising the temperature of the semiconductor chip 10 towards the target temperature T4) (FIG. 4).

The semiconductor chip 10 that does not satisfy the temperature characteristics of the parasitic diode 15 may be removed as a defective product after step S1 and before step S2. Next, after moving the test stage 113 to the transfer arm 111 side (the same process as step S104 in FIG. 10), the transfer arm 111 picks up the tested semiconductor chip 10 on the test stage 113 and transfers and stores it in the supply tray 118 (the same process as step S105 in FIG. 10). The test is completed by repeating the processes of steps S1 to S9 for each of semiconductor chips 10 to be tested.

When testing the same model of semiconductor chips repeatedly consecutively, because the temperatures T1 to T4 of the semiconductor chip are about the same among the chips, steps S2, S4, S6, and S8 (the steps of measuring the forward voltage Vf of the parasitic diode 15 to obtain the temperatures T1 to T4 of the semiconductor chip) may be omitted for some of the subsequent chips, and the processes of S3, S5, and S7 may be performed under respective prescribed same conditions. When the semiconductor device 13 has a temperature sensor, the contact block 120 having the probe terminals 114 for applying a voltage between the main electrodes of the semiconductor device 13 and the probe terminals 114 for applying a voltage between the main electrodes of the temperature sensor is installed in the test apparatus 110 in advance.

The calculation processes described in the embodiments above can be realized by executing a program prepared in advance on a computer such as a personal computer or a workstation. This program and the temperature characteristics of the parasitic diode 15 of the semiconductor device 13 may be stored on a computer-readable non-transitory recording medium such as a hard disk, flexible disk, CD-ROM, MO, or DVD, and are executed or retrieved by reading them from the recording medium via the computer, for example. Further, this program may be a transmission medium that can be distributed via a network such as the Internet.

As described above, according to the embodiments of the present invention, a predetermined voltage is applied to the semiconductor device manufactured on the semiconductor chip via the probe terminals to turn on the semiconductor device to generate heat. By generating heat in the semiconductor device in this way, the temperature of the semiconductor chip is actively raised to compensate for the temperature drop due to the contact of the probe terminals, and is stabilized at a set temperature. As a result, the preheating time of the semiconductor chip can be shortened. Further, it is possible to avoid starting the electrical characteristics test in a state where the temperature of the semiconductor chip has not been stabilized at the set temperature. Therefore, the electrical characteristics of the semiconductor chip can be accurately tested in a short time.

Further, according to the embodiments of the present invention, the voltage applied to heat the semiconductor device manufactured on the semiconductor chip can be applied via the probe terminals. The applied voltage for generating heat in the semiconductor device is calculated from the temperature difference between the set target temperature for testing the semiconductor chip and the calculated/obtained temperature. The calculated temperature of the semiconductor chip is calculated based on the measured value of the forward voltage of the parasitic diode and the temperature characteristic of the parasitic diode. These values can be calculated or obtained by a program prepared in advance. Therefore, the electrical characteristics of the semiconductor chip can be tested using the existing test equipment without adding new equipment.

WORKING EXAMPLES

Figure 5:
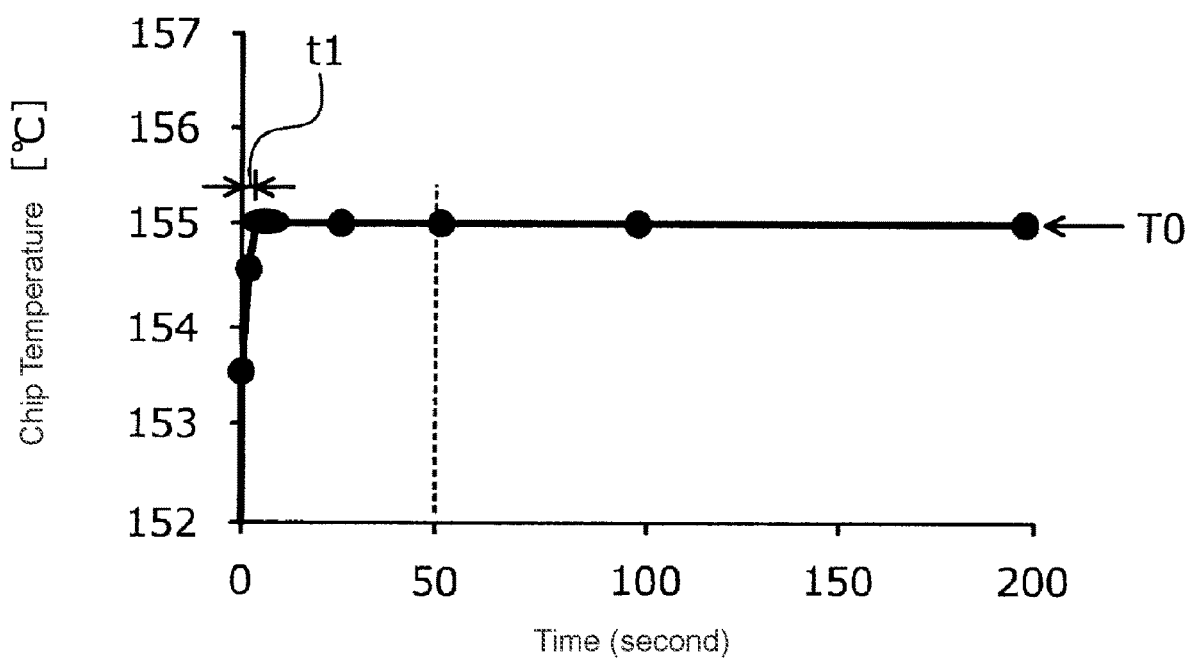
FIG. 5 is a characteristic diagram showing the relationship between the elapsed time of testing the semiconductor device and the temperature of a semiconductor chip according to an embodiment of the present invention.
Figure 6:
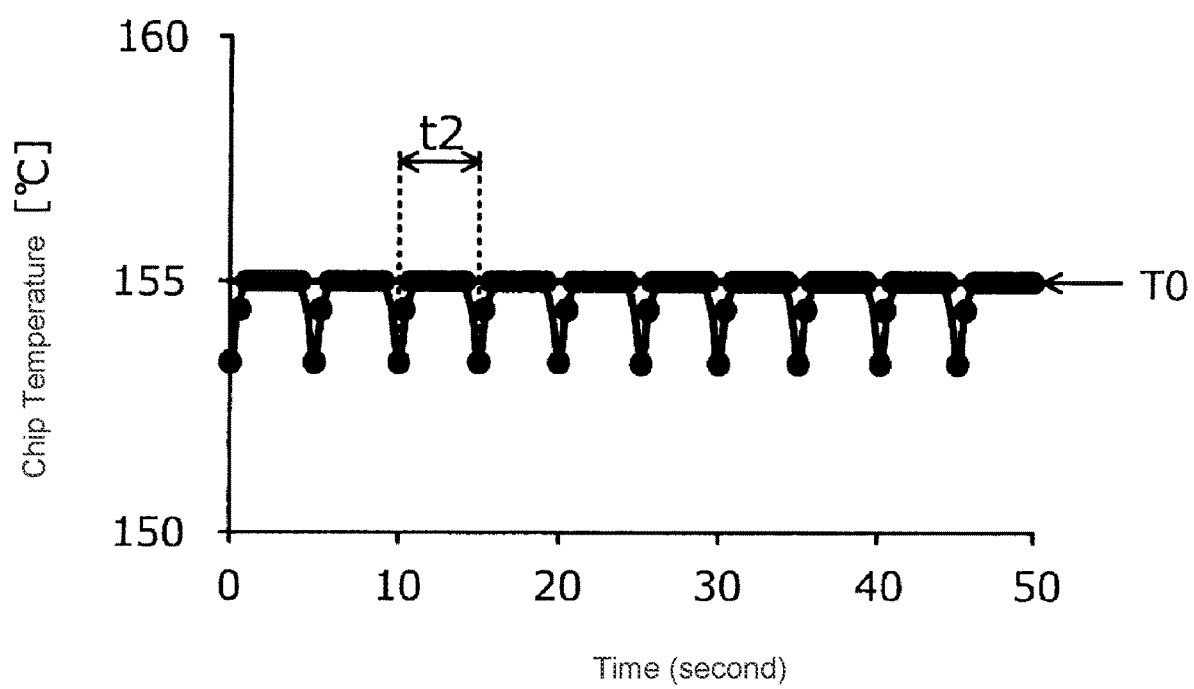
FIG. 6 is a characteristic diagram showing an enlarged graph of the temperature of the semiconductor chip during a predetermined period from the operation of the test apparatus of FIG. 5.
Figure 7:
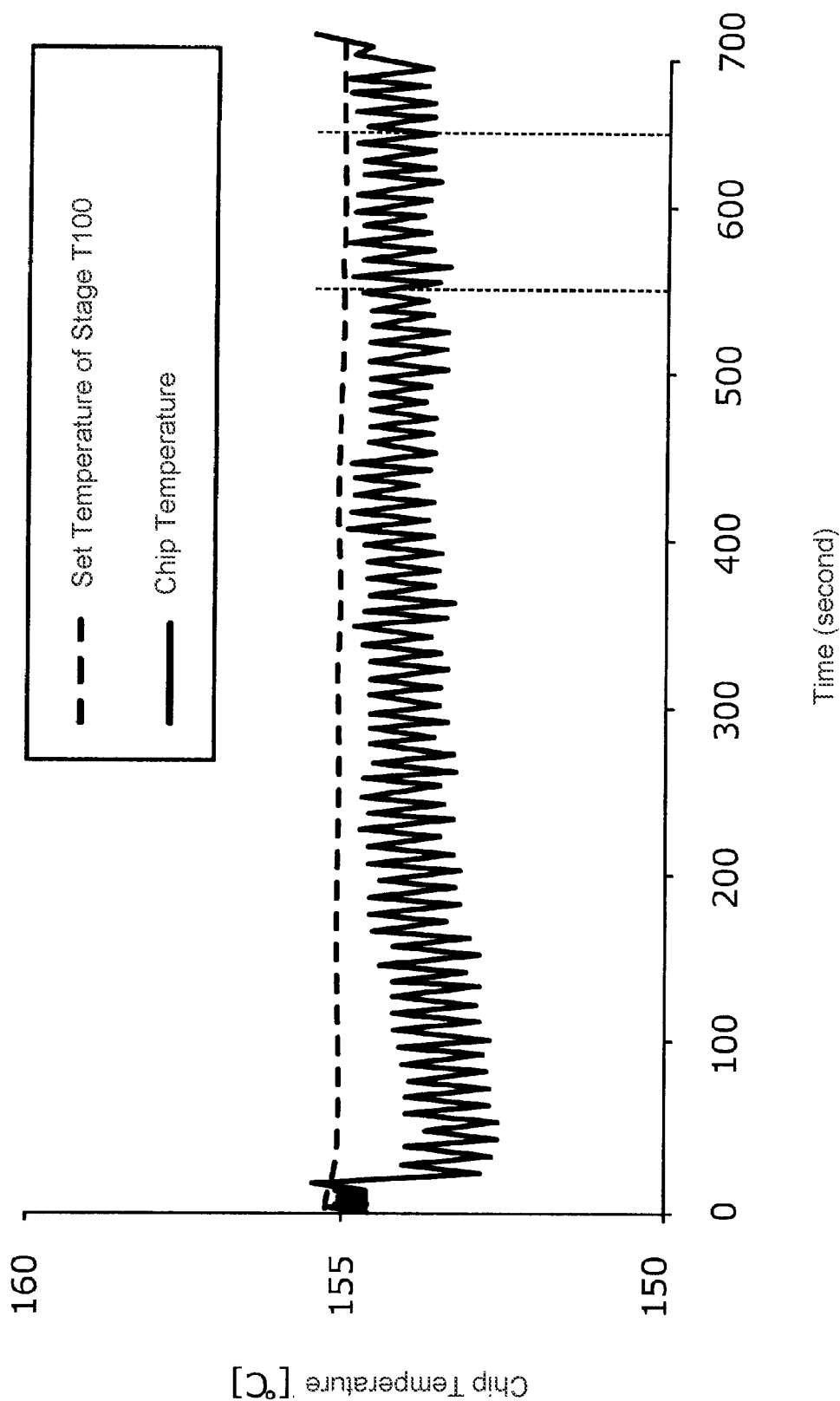
FIG. 7 is a characteristic diagram showing the relationship between the elapsed time of testing the semiconductor device, and the temperature (chip temperature) of a semiconductor chip in a conventional testing method.
Figure 8:
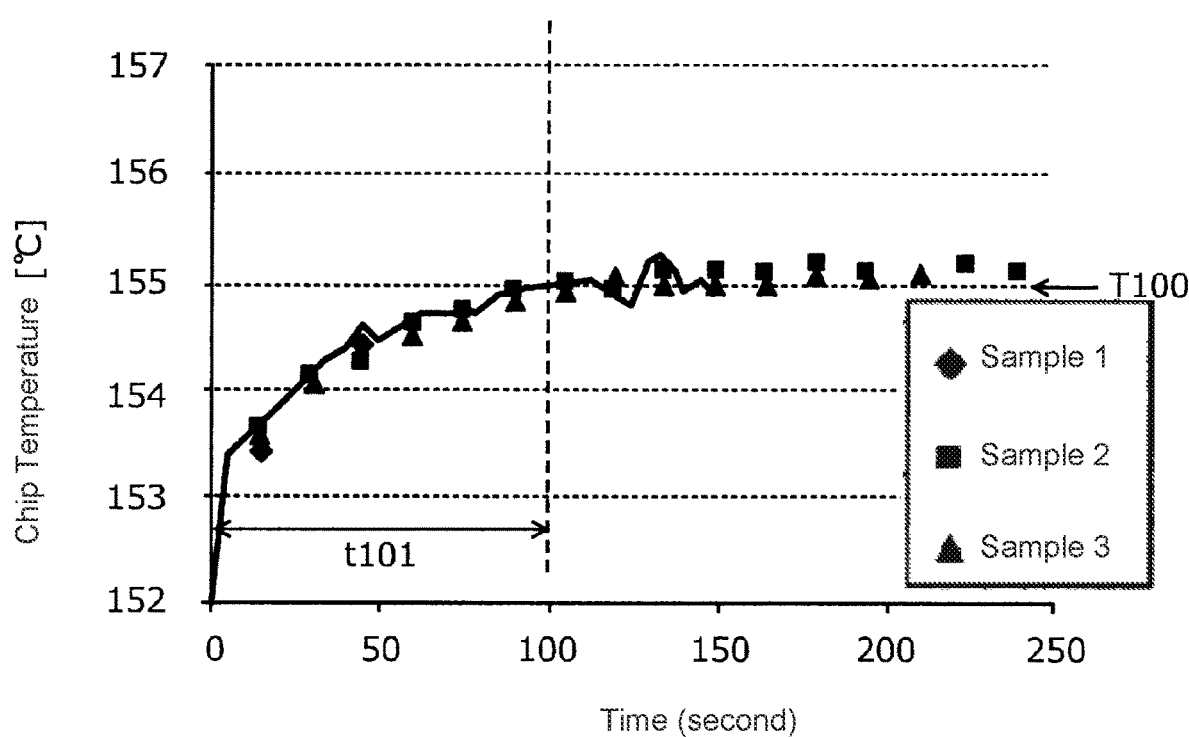
FIG. 8 is a characteristic diagram showing an enlarged graph of the temperature of the semiconductor chip at the initial stage of operation of the test apparatus of FIG. 7.
Figure 9:
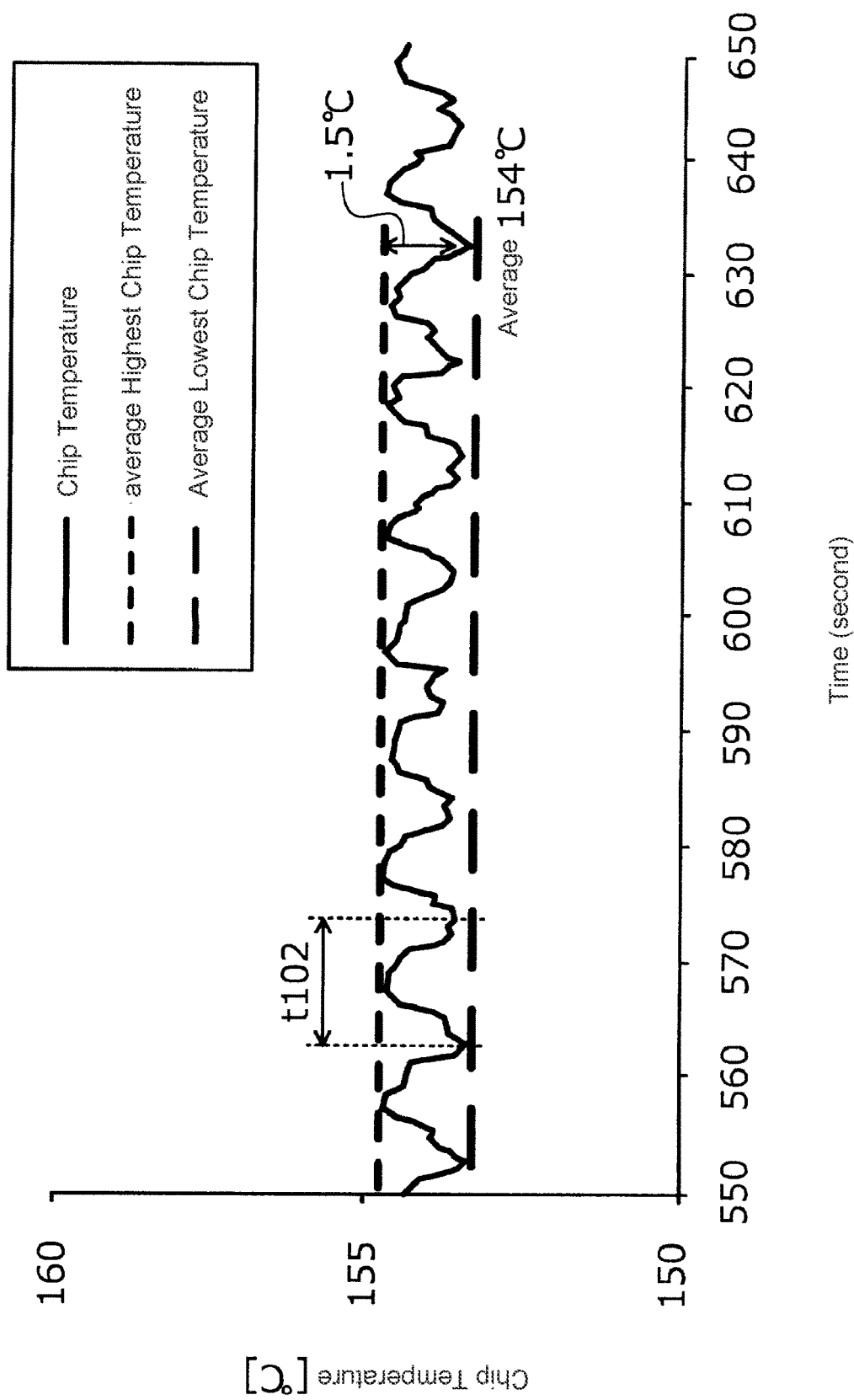
FIG. 9 is a characteristic diagram showing an enlarged graph of the temperature of the semiconductor chip after a lapse of a predetermined period from the operation of the test apparatus of FIG. 7.

The test method of the semiconductor device according to the above-described embodiments was verified. FIG. 5 is a characteristic diagram showing the relationship between the test elapsed time of the semiconductor device according to the embodiment and the temperature of the semiconductor chip (chip temperature). FIG. 6 is a characteristic diagram showing an enlarged diagram of the temperature of the semiconductor chip during a predetermined period from the operation of the test apparatus of FIG. 5. FIG. 7 is a characteristic diagram showing the relationship between the test elapsed time of the conventional method of testing a semiconductor device and the temperature of the semiconductor chip (chip temperature). FIG. 8 is a characteristic diagram showing an enlarged graph of the temperature of the semiconductor chip at the initial stage of operation of the conventional test of FIG. 7. FIG. 9 is a characteristic diagram showing an enlarged graph of the temperature of the semiconductor chip after a lapse of a predetermined period from the operation of the conventional test of FIG. 7.

With respect to a plurality of semiconductor chips 10 (hereinafter referred to as working examples) continuously tested by applying the semiconductor device test method (see the right side of FIG. 3) of the above-described embodiment, the temperatures T1 to T4 of the semiconductor chip 10 obtained in steps S2, S4, S6, and S8 are shown continuously in FIGS. 5 and 6 with the test elapsed time as the horizontal axis. Further, as a comparison, with respect to a plurality of semiconductor chips 101 (hereinafter referred to as conventional examples) continuously tested by applying a conventional semiconductor device test method (see the left side of FIG. 3 and FIG. 10), the temperature at the time of contact of the probe terminals 114 and the temperature at the time of the test after the elapse of the preheat time t101 are shown continuously in FIGS. 7 to 9 with the elapsed test time as the horizontal axis.

From the results shown in FIGS. 5 and 6, in the working examples, it can be said that it took about 1 second of the preheat time t1 to reach the set temperature T0 (FIG. 5) for the first semiconductor chip 10, but after that, the temperature fluctuation for all the subsequent semiconductor chips 10 continuously tested was effectively nonexistent, and the set temperature T0 for testing was stabilized and maintained (FIGS. 5 and 6). In FIG. 6, the period t2 between the adjacent measurement points of the lowest temperature is the test time of a single semiconductor chip 10.

On the other hand, from the results shown in FIGS. 7 to 9, in the conventional example, the preheat time t101 for the first semiconductor chip 10 was several tens of seconds to several hundreds of seconds from the operation of the test apparatus 110 (FIG. 8). Further, it was confirmed that the temperature of the semiconductor chip 101 could not be raised to the set temperature T100 (=155° C.) during a certain initial period (from 0 seconds to 550 seconds) from the operation of the test apparatus 110 (FIG. 7). Further, it was confirmed that the temperature of the semiconductor chip 101 fluctuates at an average of about 1.5° C. per unit chip due to the contact of the probe terminals 114 even after a predetermined period of time has elapsed from the operation of the test apparatus 110 (after 550 seconds).

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

As described above, the method for testing a semiconductor device according to the present invention is useful for measuring the electrical characteristics of a semiconductor chip that has been maintained at a high temperature (for example, 150° C. or higher) before the probe terminals come into contact with the chip.

What is claimed is:

1. A method for testing a semiconductor chip that has front surface electrodes and a back surface electrode and has a pn junction constituting a diode therein, the method comprising:
   placing a semiconductor chip on a metal stage so that the back surface electrode is in contact with the metal stage;
   raising a temperature of the semiconductor chip on the metal stage towards a predetermined target temperature by raising a temperature of the metal stage to the predetermined target temperature;
   causing probe terminals to be in contact with the front surface electrodes of the semiconductor chip;
   obtaining a temperature of the semiconductor chip by measuring electrical characteristics of the diode through at least one of the front surface electrodes and the back surface electrode and by referring to prescribed temperature characteristics of the diode;
   if the obtained temperature is not within a prescribed tolerance from the predetermined target temperature, heating up the semiconductor chip by applying voltage between one or more of the front surface electrodes and the back surface electrode;
   repeating the step of obtaining the temperature of the semiconductor chip and the step of heating up the semiconductor chip until the obtained temperature increases and reaches the predetermined target temperature within the prescribed tolerance; and
   thereafter, testing electrical characteristics of the semiconductor chip through the front surface electrodes and the back surface electrode.

2. The method according to claim 1, wherein the diode is a parasitic diode in the semiconductor cell.

3. The method according to claim 1, wherein the voltage applied in the step of heating up the semiconductor chip is such that a resulting temperature increase does not exceed a difference between the predetermined target temperature and the obtained temperature.

4. The method according to claim 1, wherein in the step of obtaining the temperature of the semiconductor chip, the electrical characteristics of the diode to be measured are a forward voltage of the diode, and the prescribed temperature characteristics of the diode referred to are forward characteristics of the diode indicating a relationship between a temperature and the forward voltage.

5. The method according to claim 2, wherein the voltage applied in the step of heating up the semiconductor chip is such that a resulting temperature increase does not exceed a difference between the predetermined target temperature and the obtained temperature.

6. The method according to claim 2, wherein in the step of obtaining the temperature of the semiconductor chip, the electrical characteristics of the diode to be measured are a forward voltage of the diode, and the prescribed temperature characteristics of the diode referred to are forward characteristics of the diode indicating a relationship between a temperature and the forward voltage.

7. The method according to claim 1, further comprising:
placing another semiconductor chip of the same configuration as said semiconductor chip on the metal stage so that the back surface electrode is in contact with the metal stage;
repeatedly performing the step of heating up, which has been performed for said semiconductor chip, with respect to said another semiconductor chip under same conditions as for said semiconductor chip, without performing the repeated step of obtaining the temperature that has been performed for said semiconductor chip; and
thereafter, testing electrical characteristics of said another semiconductor chip through the front surface electrodes and the back surface electrode.

* * * * *